United States Patent [19]

Christopher et al.

[11] 4,177,433

[45] Dec. 4, 1979

[54] REEL MOTOR PREAMPLIFIER

[75] Inventors: Robert J. Christopher, Boulder, Colo.; Robert L. Schaaf, Tucson, Ariz.

[73] Assignee: International Business Machines Corporation, Armonk, N.Y.

[21] Appl. No.: 962,278

[22] Filed: Nov. 20, 1978

[51] Int. Cl.² .......................... H03F 3/20; H03F 3/68
[52] U.S. Cl. .................................. 330/265; 330/84; 330/293; 330/295
[58] Field of Search ................ 330/84, 255, 263, 265, 330/267, 295, 293; 307/315

[56] References Cited

U.S. PATENT DOCUMENTS

| | | | |
|---|---|---|---|
| 3,486,124 | 12/1969 | Eisenberg | 330/263 |
| 3,501,712 | 3/1970 | Webb | 330/267 |
| 3,675,141 | 7/1972 | Adams | 330/263 |
| 3,745,477 | 7/1973 | Freeburn | 330/255 X |
| 3,808,545 | 4/1974 | Stanley | 330/265 |
| 3,939,435 | 2/1976 | Suzuki | 330/295 X |

FOREIGN PATENT DOCUMENTS 1425925  2/1976  United Kingdom ..................... 330/267
476660  11/1975  U.S.S.R. .................................. 330/267

OTHER PUBLICATIONS

*Elektor*, "Symmetrical Power Amp.," vol. 2, No. 7-8, pp. 758-759, Jul.-Aug. 1976.

*Primary Examiner*—James B. Mullins
*Attorney, Agent, or Firm*—James A. Pershon; Joscelyn C. Cockburn

[57] ABSTRACT

A high voltage/high current circuitry includes a push-pull voltage amplification stage connected in tandem with a parallel connected push-pull current amplification stage. For the voltage amplification stage a pair of bipolar operational amplifiers are connected in parallel and operate in a push-pull manner. A pair of switching means are positioned at the output of each of the bipolar operational amplifiers while the outputs of the amplifiers are connected to the inputs through a current gain regulating means, an isolation means and a voltage divider means.

6 Claims, 1 Drawing Figure

U.S. Patent      Dec. 4, 1979      4,177,433
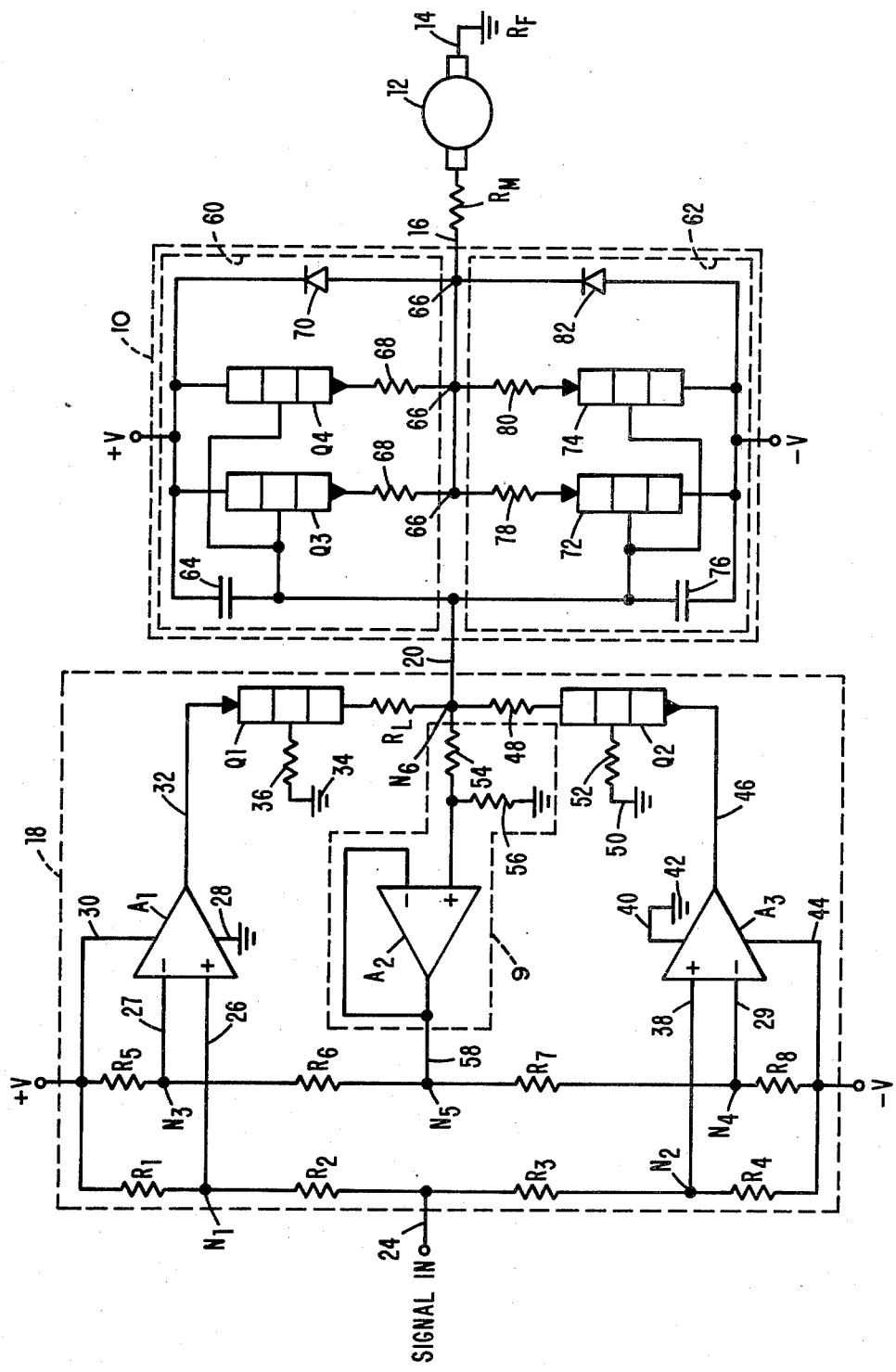

REEL MOTOR PREAMPLIFIER

BACKGROUND OF THE INVENTION

1. Field of the Invention

The present invention relates to amplifier circuitry and, particularly to an amplifier circuitry having a controlled preamplifier stage and a power amplifier stage.

2. Description of Prior Art

The use of amplifier circuitry for supplying power (i.e., electrical energy) to drive a load is well known in the prior art. The load may be a loud speaker, a motor, or a motor connected to the supply and/or take-up reel of a tape transport unit.

Conventional amplifier circuitry includes one or more amplifier stages, for example, a preamplifier stage and a power amplifier stage. Usually the preamplifier stage processes a small analog signal while the power amplifier stage processes the analog signals outputted from the preamplifier stage.

One problem associated with prior art amplifier circuitry is that often times the particular application to which the amplifier is used requires that the amplifier performance exceeds the electrical rating of the components used to fabricate the amplifier. As is well known to those skilled in the art, electrical components such as transistors, diodes, resistors, etc., are assigned specific ratings as to voltage and/or current capabilities by the manufacturers. For example, the manufacturer will list a breakdown voltage for a transistor. This means that whenever a designer uses such a transistor in an amplifier the maximum voltage which can be applied across the transistor has to be at most equal to the breakdown voltage and, preferably, less than said voltage. Any attempt to use the transistor above the prescribed rating will result in catastrophic failure.

Due to the above limitation, designers are forced to take precautionary steps so as to avoid catastrophic failure. One approach used by the prior art to solve the above problem is to use components whose electrical rating as to voltage, current, etc., is below the requirement which a particular application imposes on said component. Generally, the higher the electrical rating on a particular component the higher will be the cost of said component and the subsequent cost of a product. Moreover, it appears to be a waste of resources when a device operates below its optimum rating.

Another approach used by the prior art to solve the above problem is the use of regulators for protecting a particular component. U.S. Pat. No. 3,486,124, issued to M. F. Eisenberg exemplifies the use of regulators as a regulating device. In the Eisenberg patent a pair of voltage regulators are used to control the voltage across the output transistors of a push-pull amplifier. The approach used is to maintain the voltage of the non operating transistor to be less than its optimum rating. This is done by distributing the voltage between the non operating transistor and the associated voltage regulator.

Although the use of regulators is an improvement over the prior art. This approach suffers from one major drawback, namely, the device (i.e., the power amplifier) requires a relatively large amount of energy to ensure proper operation. Of course, the consumed energy is not delivered to the load (i.e., probably it is not performing useful work). The primary reason for the high energy consumption is that the regulator is positioned in series with the nonoperating component. In order to distribute the voltage across the regulator and the non-operating component, the regulator has to be "on" (that is in an active state). Needless to say, it behooves us to fabricate apparatus in which the energy consumption is minimized.

SUMMARY OF THE INVENTION

Due to the above prior art defects, it is therefore the object of the present invention to fabricate a more efficient amplifier circuitry than was heretofore possible.

Another object of the present invention is to fabricate an amplifier circuitry in which the energy consumption is relatively low.

Still another object of the present invention is to fabricate an amplifier circuitry wherein the electrical characteristics (such as voltage, current, etc.) of said circuit is above the electrical ratings for the components and to use said amplifier circuitry without damaging the components.

It is still another object of the present invention to fabricate an amplifier circuitry capable of delivering a relatively high voltage and a relatively high current.

The above objectives are realized by an amplifier circuitry which includes a preamplifier stage connected in tandem with a power amplifier stage.

The preamplifier stage is primarily concerned with voltage amplification while the power amplifier stage is primarily concerned with current amplification. The combination (i.e. preamplifier and power amplifier) delivers a high voltage/high current signal to a load.

The power amplifier stage includes building blocks of power transistors coupled in a Darlington compound connection. The building blocks are further interconnected in a parallel configuration to form at least two groups with the emitter of each building block tied to a common node. The groups are arranged to operate in a push-pull manner. By interconnecting the building blocks in a parallel arrangement, the current amplication is significantly improved. Likewise, the current handling characteristic of the power amplification stage exceeds the rating of the components.

A pair of energy storage means are connected to the input of the amplifier. The energy storage means prevents oscillations due to the high current gain of the amplifier. A pair of unidirectional conductive devices are positioned at the output of the amplifier.

In one feature of the invention a resistive means is interconnected in the emitter circuit of each building block. The resistive means ensures that equal amounts of current are conducted by each of the building blocks of the parallel configuration.

The preamplifier stage includes at least two bipolar operational amplifiers. The operational amplifiers are interconnected to operate in a push-pull manner. A first voltage dividing network is connected to a first input terminal of the bipolar operational amplifiers. The network divides an input bipolar signal into a unipolar signal. The outputs of the operational amplifiers are connected to a common node. A switching means is interconnected between the common node and the output of each of the bipolar amplifiers. The switching means prevents current from flowing from the active (i.e., the conductive bipolar operational amplifier) to the nonactive (i.e., the nonconductive bipolar operational amplifier) of the push-pull arrangement.

In one feature of the invention to gain of each of the operational amplifiers is controlled by a feedbck loop which interconnects the output of each amplifier to one of its bipolar inputs. The feedback loop is characterized by a gain controlled circuit means.

In still another feature of the invention, a second voltage dividing network is positioned betwen the feedback loop and the bipolar input. The second voltage dividing network divides the feedback bipolar signal into a unipolar signal.

In yet another feature of the invention a third operational amplifier is interconnected in the feedback loop so as to isolate the effect of the gain controlled circuit means from the effect of the second voltage dividing network.

The foregoing objects, advantages and other features of the invention will be apparent from the following more particular description of preferred embodiments of the invention, as illustrated in the accompanying drawings.

BRIEF DESCRIPTION OF THE DRAWINGS

The single FIGURE is a schematic showing the preamplifier stage and the power amplifier stage of the present invention.

DESCRIPTION OF THE DETAILED EMBODIMENT

Although the device described hereinafter may be used in any environment where a load is driven by an amplifier circuitry, the device lends itself best to driving the motor used for controlling the take-up reel or supply reel of a tape transport unit. As such, the device will be described in the tape transport environment. However, the description of the present device in a tape transport environment should be construed as illustrative only and not as a limitation on the scope of the invention.

Referring now to the FIGURE, a power amplifier 10 is connected through a current limiting resistor $R_m$ to one side of the armature of a drive motor 12. The other side of the armature of the motor is connected to a reference potential $R_f$ by a conductor 14. A reel of tape (not shown) is interconnected in a conventional manner by a spindle (not shown) to the drive shaft of motor 12. The motor 12 can rotate the tape reel bidirectionally in response to a signal generated by the power amplifier 10 on conductor 16.

The power amplifier 10 includes a preamplifier stage 18 interconnected by conductor 20 to power amplifier stages 60 and 62. The preamplifier stage is primarily concerned with the voltage amplification characteristics of the power amplifier while the power amplifier stage is primarily concerned with the current amplification aspect of the invention. Both the preamplifier stage and the power amplifier stage operate simultaneously to generate a high voltage, high current signal to drive motor 12.

Still referring to the FIGURE, the preamplifier stage includes an input conductor 24. The preamplifier receives an input signal SIG IN and amplifies said signal and outputs the amplified signal on conductor 20. The input signal may be a small analog signal generated by a controller (not shown) of a tape transport unit. Also the input signal may be bipolar (that is positive or negative). A voltage dividing network, comprised of resistors R1, R2, R3 and R4 are connected to conductor 24. As will be explained subsequently, the voltage dividing network hereinafter called first signal processing means, operates on the input signal to offset and scale said signal. A pair of bipolar operational amplifiers A1 and A3, respectively, are connected in parallel and symmetrical with one another. Operational amplifier A1 has a pair of bipolar inputs. One of the bipolar inputs, preferably the positive terminal, is interconnected to node N1 by conductor 26. Node N1 is positioned symmetrically with resistors R1 and R2. One of the controlled terminals of bipolar operational amplifier A1 is tied to a reference potential 28. In the preferred embodiment of this invention, the reference potential is ground. Controlled terminal 30 is tied to a supply voltage source $+V$. The output terminal 32 is connected to node N6 via limiting means Q1 connected in series with resistive means RL. As will be explained subsequently, the limiting means prevents current from flowing in the lower half of the push-pull configured A1 and A3 when A1 is conducting and A3 is not. As such, the power dissipation in the circuit is minimized and assures that maximum current is delivered to motor 12 without unnecessary utilization of power by the components of the preamplifier stage of power amplifier 10. Likewise, resistive means RL is a current limiting resistor and prevents the drawing of excessive amounts of current from operational amplifier A1. In the preferred embodiment of this invention, the limiting means Q1 is a transistor with the emitter connected to output terminal 32, while the base of the transistor is tied to a reference potential 34 through a resistor 36. The resistor 36 bias the transistors to operate in a predetermined portion of its characteristic curve. In the preferred embodiment of this invention, reference potential 34 is ground. The collector of transistor Q1 is tied to RL. Likewise, bipolar operational amplifier A3 includes a pair of bipolar input. One of the bipolar inputs, preferably the positive input, is connected to conductor 38. The conductor is connected to node N2. Node N2 is positioned symmetrically with resistors R3 and R4. Controlled terminal 40 is tied to reference potential 42. In the preferred embodiment of this invention, reference potential 42 is at ground potential. Controlled terminal 44 is tied to a power supply source. In the preferred embodiment of this invention, the power supply volt is $-V$. Similar to operational amplifier A1, the operational amplifier A3 has its output terminal 46 tied to node N6 through limiting means Q2 and resistive means 48. The function served by limiting means Q2 and resistive means 48 is identical to the function previously described and preformed by limiting means Q1 and resistive means RL. Essentially, limiting means Q2 prevents current from flowing in the upper half of the push-pull circuit configuration of A1 and A3 when A3 is conducting while resistive means 48 limits the amount of current pulled from operational amplifier A3. The limiting means Q2 includes a transistor having its base tied to reference potential 50 through a resistor 52 while the emitter is tied to output terminal 46. The other terminals of operational amplifier A1 and A3, and preferably the negative terminals (27 and 29) are interconnected to nodes N3 and N4 respectively. Nodes N3 and N4 are positioned on a second signal processing means which includes resistors R5, R6, R7 and R8. The second signal processing means receives a feedback control signal generated by feedback means 9 and supplies said feedback signal to one terminal, preferably the negative terminal, of operational amplifiers A1 and A3 respectively. The feedback means 9 includes a gain control means comprised of resistors 54 and 56 respectively. The gain control means regulates the gain for the feedback loop of the preamplifier stage of power amplifier 10. The output from the gain regulating means is fed into one terminal of bipolar operational amplifier A2. The other terminal of the bipolar operational amplifier is tied to the output 58 of said amplifier. The operational amplifier A2 is, in effect, a voltage follower and operates to isolate the gain control means from the second signal processing means of R5, R6, R7 and R8.

Still referring to the FIGURE, the power amplifier stage 10 includes an input conductor 20 and an output conductor 16. The signal outputted from preamplifier stage 18 is fed into the power amplifier stage 10 along conductor 20. The power amplifier stage is symmetrical about conductor 16 and includes upper operating half 60 and lower operating half 62. The upper operating half and the lower operating half are symmetrical about conductor 16 and operating a push pull manner. The upper operating half 60 comprises a first current amplification means Q3 connected in parallel with a second current amplification means Q4. Both the first current amplification means and the second current amplification means are fabricated from a group of transistors connected in the well known Darlington compound connection. Details of the Darlington compound configuration will not be given since this is well known to anyone skilled in the art. Suffice it to say that the Darlington configuration allows for maximum current amplification. Also, in a Darlington configuration the plurality of transistors are usually connected in tandem with the emitter of one transistor connected to the base of another transistor and so on until a predetermined number of transistors are interconnected to generate a desired degree of amplification. Biasing means and other necessary operating means are connected to the Darlington transistors in well known prior art methods. A more detailed discussion of a Darlington configured circuit is given in the above described U.S. Pat. No. 3,486,124.

Referring again to the FIGURE, by connecting the first current amplification means Q3 and second current amplification means Q4 in parallel, the current amplification characteristics of the amplification means are increased substantially. The collectors of the transistors in first current amplification means Q3 and second current amplification means Q4 are tied to a positive voltage supply means while the base of the transistors of Q3 and Q4 are tied to the positive voltage source through energy control means 64. In the preferred embodiment of this invention, energy control means 64 is a capacitor. The emitter of the transistors in Q3 and Q4 are tied to a common node 66 on conductor 16 through equalizing means 68. The equalizing means 68 insures that an equal amount of current flows through Q3 and Q4 and hence neither of the components Q3 and Q4 will be exposed to an unusually large amount of current flow. In the preferred embodiment of this invention, equalizing means 68 is a resistor. A diode 70 is positioned between the collector circuit and node 66 of current amplification means Q3 and Q4. The diode isolates the first and second current amplification means from external disturbance such as disturbance generated by motor 12 or any other attached load.

Still referring to the FIGURE, the lower half of the power amplifier stage includes a third current amplification means 72 connected in parallel with a fourth current amplification means 74. Each of the current amplification means, 72 and 74, includes a plurality of transistors configured in a Darlington configuration. The current amplification means 72 and 74 are identical to the previously described current amplification means Q3 and Q4. The base of the third and fourth amplification means is tied through an energy controlled means 76 to a negative voltage supply means. In the preferred embodiment of this invention, the energy controlled means is a capacitor. Likewise, the emitter of the third and fourth amplification means is tied through equalizing means 78 and 80 respectively to node 66 of conductor 16. As previously described, equalizing means 78 and 80 equalizes the current flowing in the third and fourth amplification means. In the preferred embodiment of this invention, equalizing means 78 and 80 are resistors. An isolating means, 82, interconnects the collector of the third and fourth current amplification means with the common node 66. In the preferred embodiment of this invention, the isolating means is a diode.

Excellent results are achieved in one implementation utilizing components having the following values, it being understood that the values are given merely by way of example:

TABLE 1

| ELEMENTS | VALUE |
|---|---|
| R1-R8 | 100KΩ |
| 54 | 20KΩ |
| 36,52,56 | 10KΩ |
| 48 $R_L$ | 30 Ω |
| 68,78,80 | 0.2 Ω |
| 64,76 | .033 MFD |
| $R_M$ | 0.5 Ω |

OPERATION

In operation a bipolar input signal is applied to input SIG IN. The input signal is offset and is scaled by the first signal processing means (R1, R2, R3, R4). The value voltage appearing at either amplifier A1 or A3 may be summarized as (+V)-N1-SIGIN-N2-(−V). This signal appears at either node N1 or N2 depending on the sign of the input signal. Operational amplifiers A1 and A3, hereinafter called OP AMP A1 and A3, serve as non-inverting amplifiers of the signals at nodes N1 and N3, respectively, and are configured to work in a push-pull mode. Transistors Q1 and Q2 serve as switches to isolate the upper half of the configuration from the lower half and thus prevent shunting current from OP AMP A1 to A3 and vice versa. The output voltage appearing at node N6 is fed back to operational amplifiers A1 and A3 through gain control means 54 and 56, through operational amplifier A2, to the second signal processing means (R5, R6, R7 and R8). The voltage appearing at the input of either A1 or A3 may be characterized as (+V)-N3-N5-N4-(−V). Resistors RL, and 48 respectively are simple current limiting resistors to prevent flowing of excessive current from op amps A1 and A3, while the gain of the amplifiers are controlled by resistors 54 and 56.

As stated previously, the power amplifier stage 10 is basically paralleled power Darlingtons Q3, Q4, 72 and 74 arranged in a push-pull configuration. With parallel configuration the current handling capabilities of the power amplifier stage is significantly improved. Current flow in either Q3, Q4, 72 and 74 are equalized by resistors 68, 78 and 80. Likewise, the capacitors 64 and 76 prevent oscillation which tends to occur due to the high gain of the Darlington configuration. Likewise, diodes 70 and 82 prevent damage to the amplification means if external disturbance occurs. An example may serve to further clarify the operation of the circuit. Let +V be +30 volts and −V be −0 volts. Consider the preamplifier stage with input and output initially at ground potential. This means that node N5 will be ground and, consequently, Nodes N1 and N3 will be +15 volts and N2 and N4 will be −15 volts. Suppose that an input signal of +6 volts is applied to SIG IN. Node N1 will go to +18 volts and N2 will go to −12 volts. Since the non-inverting inputs of operational amplifiers A1 and A3 will be more positive than the inverting inputs, both operational amplifiers will begin to saturate at their positive supply voltages. Thus, the outputs of A1 and A3 will tend towards +30 volts and ground, respectively. This change in operational amplifier output voltages will tend to turn transistors Q2 off and Q1 on, thereby connecting the output of operational amplifier A1 to the preamplifier output node N6. The output voltage of operational amplifier A1 will continue to increase until the voltage node N3 becomes equal (or nearly equal) to the voltage at node N1. It can be seen that Node N3 will equal N1 when Node N5=SIGIN, or when preamp output equals three times SIGIN. In this example, the output voltage stabilizes at +18 volts. At negative input voltages the operational circuit is identical except that it is the output voltage of Op Amp A3, not A1 which determines the preamplifier output voltage.

This completes the detailed description of the invention.

While the invention has been particularly shown and described with reference to a preferred embodiment thereof, it will be understood by those skilled in the art that various changes in form and details can be made therein without departing from the spirit and scope of the invention.

Having thus described my invention, what I claim as new, and desire to secure by Letters Patent is:

1. A bipolar amplifier circuit for supplying bipolar signals to a load, said amplifier circuit comprising in combination:
    a preamplifier stage having an output terminal; and
    a power amplifier stage having an input terminal connected in tandem with the output terminal of the preamplifier stage and an output terminal to supply a high voltage/high current signal to the load;
    said preamplifier stage including a first signal operational amplification means;
    a second signal operational amplification means interconnected in parallel with the first signal amplification means;
    a first signal dividing means interconnecting a first input of the first and second amplification means; said signal dividing means being operable for receiving a bipolar signal and providing a unipolar signal therefrom;
    a pair of switching means one of each positioned in the output terminal of the first and second amplification means; each of said switching means being operable to regulate an electrical characteristic of the associated amplification means;
    a second signal dividing means interconnecting a second input of the first and second amplification means and operating as a voltage divider to provide a unipolar signal to each of the first and second amplification means;
    a gain controlled loop interconnecting the output of said switching means to the second signal dividing means to direct a portion of the bipolar output signal to said second signal dividing means to control the first and second amplification means such that the signal amplification of the activated amplification means is supported;
    said power amplifier stage including a third signal amplification means;
    a fourth signal amplification means connected in parallel, at a common node, with the third amplification means whereby each of the third and fourth signal amplification means are arranged in a parallel configuration to maximize signal amplification.

2. The amplifier circuit means as claimed in claim 1, wherein the third and the fourth signal amplification means each include a first set of transistors connected in a Darlington type configuration and a second set of transistors connected in a Darlington type configuration whereby the first and the second set of Darlington type configurations are interconnected in parallel to thereby maximize signal amplification.

3. An improved amplifier circuit means comprising in combination:
    a first bipolar operational amplifier having an output terminal and a pair of input terminals;
    a first power supply means connected to said first operational amplifier;
    a second bipolar operational amplifier connected in parallel with the first bipolar operational amplifier; said second bipolar amplifier having a pair of input terminals;
    a second power supply means connected to said second operational amplifier;
    a first signal dividing network providing a unipolar signal from an input bipolar signal to one of the input terminals of the first and the second operational amplifiers;
    a first limiting switching means interconnecting the output of the first operational amplifier and a common node;
    a second limiting switching means operably interconnecting the common node and the output of the second bipolar operational amplifier;
    a second signal dividing network interconnecting the other input terminals of the first and second operational amplifier;
    a control loop interconnecting the common node with the second signal dividing network and operable to control the gain of the first and second operational amplifiers and to isolate the output of said limiting switching means from the second signal dividing network.

4. An improved amplifier circuit as defined by claim 3 further including a power amplifier having an input node and an output node said amplifier comprising in combination;
    a first set of transistors connected in a Darlington configuration;
    a second set of transistors connected in a Darlington configuration; said first and second sets of transistors are interconnected in a parallel configuration;
    a first resistive means interconnected in the emitter circuit of the first set of transistors;
    a second resistive means interconnected in the emitter circuit of the second set of transistors; said first and second resistive means being operable to equalize current flow through the first set and the second set of transistors;
    a third set of Darlington configured transistors;

a fourth set of Darlington configured transistors connected in parallel with the third set of transistors whereby the first and second sets of parallel configured transistors are arranged parallel to the third and fourth set of parallel configured transistors so that the combination operates in a push-pull manner.

5. The power amplifier as claimed in claim 4, including current equalizing means positioned in the emitter circuit of the third and fourth set of transistors.

6. An improved push-pull amplifier means comprising in combination:
   a first signal operational amplification means;
   a second signal operational amplification means connected in a parallel configuration with the first signal amplification means;
   a first signal processing means interconnecting a first input of the first and second signal amplification means; said signal processing means operating as a voltage divider to provide a unipolar signal from a bipolar signal to each of the amplification means;
   a pair of limiting switching means, one of each connected to one of the signal amplification means and operable to isolate the amplification means from each other during activation of one amplification means;
   a second signal processing means interconnecting a second input of the first and second signal amplification means and operating as a voltage divider to provide a unipolar signal to each of the amplification means; and
   a controlled feedback loop interconnecting the output of said switching means to the second signal processing means whereby the second signal processing means receives a bipolar control signal from the controlled loop and provides a unipolar signal to control the first and second amplification means such that the signal amplification of the activated amplification means is supported.

* * * * *